(12) United States Patent
Wang et al.

(10) Patent No.: US 10,476,599 B2
(45) Date of Patent: Nov. 12, 2019

(54) JOINT SOURCE AND LDPC CODING BASED CODING MODULATION FOR ULTRA-HIGH-SPEED OPTICAL TRANSPORT

(71) Applicant: NEC Laboratories America, Inc., Princeton, NJ (US)

(72) Inventors: Ting Wang, West Windsor, NJ (US); Ivan Djordjevic, Tucson, AZ (US)

(73) Assignee: NEC Corporation (JP)

( * ) Notice: Subject to any disclaimer, the term of this patent is extended or adjusted under 35 U.S.C. 154(b) by 0 days.

(21) Appl. No.: 15/483,587

(22) Filed: Apr. 10, 2017

(65) Prior Publication Data
US 2018/0091225 A1 Mar. 29, 2018

Related U.S. Application Data

(60) Provisional application No. 62/323,883, filed on Apr. 18, 2016.

(51) Int. Cl.
| | |
|---|---|
| H04B 10/04 | (2006.01) |
| H04B 10/516 | (2013.01) |
| H04B 10/61 | (2013.01) |
| H03M 13/25 | (2006.01) |
| H04J 14/06 | (2006.01) |
| H03M 13/00 | (2006.01) |
| H04B 10/532 | (2013.01) |
| H04B 10/54 | (2013.01) |
| H03M 7/30 | (2006.01) |

(52) U.S. Cl.
CPC ...... *H04B 10/5161* (2013.01); *H03M 13/255* (2013.01); *H03M 13/6312* (2013.01); *H04B 10/532* (2013.01); *H04B 10/541* (2013.01); *H04B 10/612* (2013.01); *H04B 10/614* (2013.01); *H04B 10/616* (2013.01); *H04J 14/06* (2013.01); *H03M 7/6041* (2013.01)

(58) Field of Classification Search
USPC .......................... 398/184, 183, 185; 375/286
See application file for complete search history.

(56) References Cited

U.S. PATENT DOCUMENTS

| | | | | |
|---|---|---|---|---|
| 4,586,182 A | * | 4/1986 | Gallager | H04L 27/3438 375/241 |
| 5,285,497 A | * | 2/1994 | Thatcher, Jr. | G06T 9/005 348/425.2 |
| 6,374,375 B1 | * | 4/2002 | Yip | H04L 1/242 375/231 |

(Continued)

OTHER PUBLICATIONS

H.V. Beltrao Neto, "Multi-Edge Optimization of Low-Density Parity-Check Codes for Joing Source-Channel Coding", Jan. 24, 2013, SCC 2013, All pages.*

(Continued)

*Primary Examiner* — David C Payne
*Assistant Examiner* — Pranesh K Barua
(74) *Attorney, Agent, or Firm* — Joseph Kolodka

(57) ABSTRACT

A method for optical communication includes combining jointly source coding with LDPC channel coding into a nonuniform signalling by mapping low-complexity variable-length prefix codes onto a constellation; and performing arbitrary nonuniform signalling, where information bits and parity bits are transmitted with different modulation schemes.

14 Claims, 7 Drawing Sheets

(56) References Cited

U.S. PATENT DOCUMENTS

| | | | | |
|---|---|---|---|---|
| 2009/0102852 | A1* | 4/2009 | Eyvazkhani | H03M 13/25 345/589 |
| 2009/0122903 | A1* | 5/2009 | Miyazaki | H03M 13/11 375/286 |
| 2012/0263251 | A1* | 10/2012 | Djordjevic | H04L 1/0042 375/261 |
| 2013/0089326 | A1* | 4/2013 | Djordjevic | H04J 14/04 398/44 |
| 2014/0164876 | A1* | 6/2014 | Gasanov | G06F 11/1048 714/769 |
| 2015/0010103 | A1* | 1/2015 | Murakami | H04L 1/0003 375/267 |
| 2016/0127046 | A1* | 5/2016 | Zhang | H04L 27/183 398/185 |

OTHER PUBLICATIONS

Frank R. Kschischang, "Optimal Nonuniform Signaling for Gaussian Channels", May 1993, IEEE Transactions on information theory, vol. 39, All pages.*

Michele Franceschini, "LDPC Coded Modulation", Apr. 2009, Speinger Science and Business Media, p. 56.*

Ivan Djordjevic, "Optimum Signal Constellation Design for High-Speed Optical Transmission", 2012, OFC/NFOEC Technical Digest, All Pages.*

I. B. Djordjevic,et al, "Spatial-domain-based hybrid multidimensional coded-modulation schemes enabling multi-Tb/s optical transport," J. Lightw. Technol., vol. 30, No. 14, pp. 2315-2328, 2012.

Cho et al, Trans-Atlantic Field Trial using Probabilistically Shaped 64-QAM at High Spectral Efficiencies and Singal Carrier Real Time 250 GB/s 16 QAM, OFC Jan. 2017.

Buchali et al, Rate Adaptation and Reach Increase by Probabilistically Shaped 64-QAM: An Experimental Demonstration, Journal of Lightwave Technology, vol. 34, No. 7, Apr. 1, 2016.

T. Liu and I. B. Djordjevic, "On the optimum signal constellation design for high-speed optical transport networks," Opt. Express, vol. 20, No. 18, pp. 20396-20406, Aug. 27, 2012.

Djordjevic et al, Multidimensional Optical Transport Based on Optimized Vector-Quantization-Inspired Signal Constellation Design, IEEE Transactions on Communications, vol. 62, No. 9, Sep. 2014.

Qu et al, Experimental Study of Nonlinearity Tolerant Modulation Formats Based on LDPC Coded Non-uniform Signaling, OFC 2017, Jan. 2017.

* cited by examiner

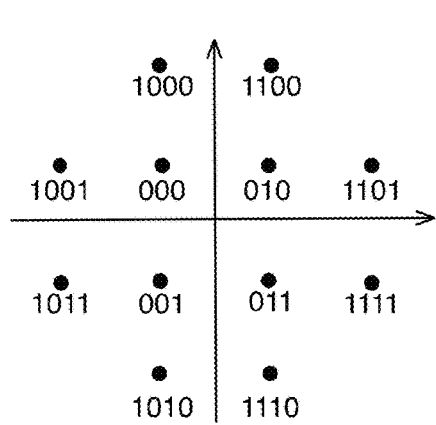
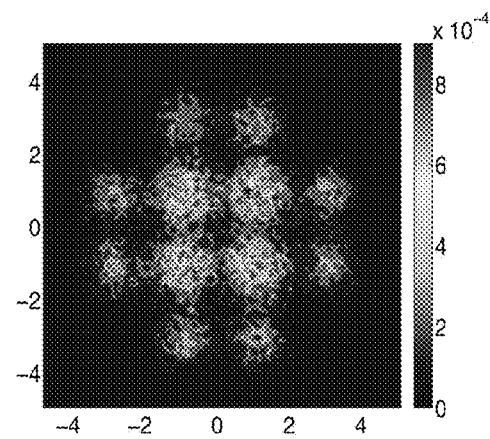
FIG. 1A
FIG. 1B
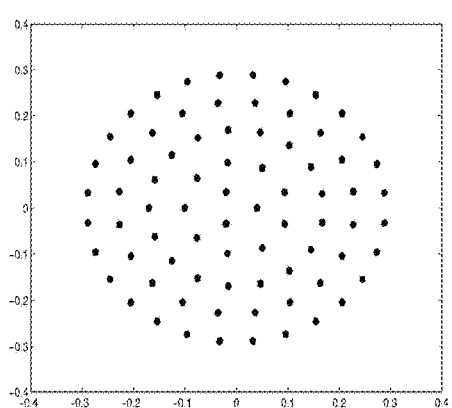
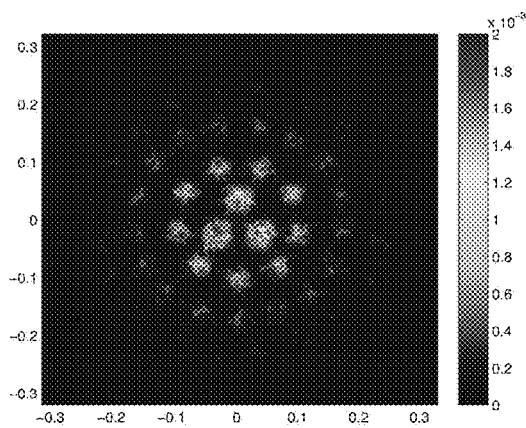
FIG. 1C
FIG. 1D

JOINT SOURCE AND LDPC CODING BASED CODING MODULATION FOR ULTRA-HIGH-SPEED OPTICAL TRANSPORT

BACKGROUND

The exponential internet traffic growth projections place enormous transmission rate demand on the underlying information infrastructure at every level. As the response, the 100 Gb/s Ethernet (100 GbE) standard has been adopted recently (IEEE 802.3ba), and 400 GbE and 1 Tb/s Ethernet (1 TbE) are currently under study. Terabit optical Ethernet technologies will be affected by limited bandwidth of information-infrastructure, high energy consumption, and heterogeneity of optical networking infrastructure. To reach beyond 1 Tb/s serial date rates, large signal constellation sizes are required for polarization-division multiplexed (PDM) single-carrier QAM systems, with commercially achievable symbol rates. Furthermore, in the context of high-speed optical communication systems, not only the performance of advanced coded modulation schemes but also their complexity plays a crucial role.

One of the enabling technologies for the next generation of optical transport is the LDPC-coded supperchannel OFDM/multiband OFDM. This approach is typically studied for single mode fiber (SMF) applications, and it is based on conventional QAM scheme. Also, some non-conventional approaches to achieve beyond 1 Tb/s serial optical transport over SMFs include generalized OFDM (GOFDM). Hybrid multidimensional coded modulation (CM), employing both electrical and optical degrees of freedom, can be used to address above constraints in a simultaneous manner. Optical degrees of freedom include the polarization and spatial modes in few-mode fibers (FMFs) and few core fibers (FCF). The electrical degrees of freedom include orthogonal prolate spheroidal wave functions. These degrees of freedom are used as the basis functions for multidimensional signaling.

SUMMARY

A method for optical communication includes combining jointly source coding with LDPC channel coding into a nonuniform signalling by mapping low-complexity variable-length prefix codes onto a constellation points; and performing arbitrary nonuniform signalling, where information bits and parity bits are transmitted with different modulation schemes.

Implementations of the system may include one or more of the following. Constellation points can be selected with a nonuniform probability distribution to improve the performance of conventional modulation schemes. When constellation points are selected according to a Maxwell-Boltzmann distribution, the ultimate shaping gain can be achieved in any dimension. The coded modulation is suitable for arbitrary nonuniform signaling, where the information bits and parity bits transmitted with different modulation schemes in order to achieve same data rate with conventional modulation scheme. The scheme significantly outperforms the conventional scheme in terms of BER achieved, energy-efficiency, and spectral-efficiency. The nonuniform signaling is achieved by employing either Huffman coding or Ziv-Lempel algorithm as the source code. The systematic LDPC coding is used as channel coding. Given that systematic LDPC coding is used, bits from source codes are transmitted unchanged, while generalized parity-check bits, derived from the parity-check matrix of a properly designed LDPC code, are additionally transmitted using uniform signaling. Only information bits are transmitted using nonuniform signaling. The signal constellation designs are provided suitable for use in the proposed joint source and LDPC coding scheme. The non-uniform constellation design is an overall search method to determine the radius of each layer and the relative angle for each layer. The constellation structure has already pre-determined by the structure of the Huffman code, so the input of the algorithm is number of points on each layer and number of layers, represented as $N_i$ and S. The algorithm will search over all possible $R_i$, which denotes the radius of each layer, with a defined step size $\Delta r$. Meanwhile, the algorithm also searches over the relative angle for each layer with another step size $\Delta \theta$. After increase of each step size, the constellation figure of merit (CFM) will be calculated. The algorithm will keep searching over a given range of radius and angle, and the combination with maximum CFM will be the output of the algorithm. With the radius of each layer and the relatively angle for each layer determined, the constellation sets can be found with the help of $N_i$ and S. The system can work with 12-QAM and 77-QAM based joint source and LDPC coded modulation schemes, as illustrative examples.

Advantages of the system may include one or more of the following:

In the conventional data transmission scheme, each point in a given constellation is equally likely transmitted, which maximizes the bit rate for a given constellation size. However, this scheme does not take into account the energy cost of various constellation points.

The idea of choosing constellation points with a nonuniform probability distribution is to improve the performance of conventional modulation schemes.

When constellation points are selected according to a Maxwell-Boltzmann distribution, the ultimate shaping gain ($\pi e/6$ or 1.53 dB) can be achieved in any dimension.

The exemplary joint source and LDPC coding based coded modulation is suitable for arbitrary nonuniform signalling, where the information bits and parity bits transmitted with different modulation schemes in order to achieve same data rate with conventional modulation scheme.

The exemplary scheme significantly outperforms the conventional scheme in terms of BER performed, energy-efficiency, and spectral-efficiency.

The nonuniform signaling is achieved by employing either Huffman coding or Ziv-Lempel algorithm as source coding.

The systematic LDPC coding is used as channel coding, to facilitate hardware implementations.

Given that systematic LDPC coding is used, bits from source codes are transmitted unchanged, while generalized parity-check bits, derived from the parity-check matrix of a properly designed LDPC code, are additionally transmitted using uniform signaling.

Only information bits are transmitted using nonuniform signaling.

The signal constellation designs are provided suitable for use in the exemplary joint source and LDPC coding scheme.

The Monte Carlo simulations indicate that the joint source and LDPC coding based coded modulation outperforms conventional coded modulation with uniform signalling in terms of BER performance and spectral efficiency.

BRIEF DESCRIPTION OF THE DRAWINGS

FIGS. 1A-1D illustrate various constellation sets, including: a 2D 12-QAM, a received constellation of nonuniform 12-QAM, a 2D 77-QAM, and a received constellation of nonuniform 77-QAM, respectively.

DESCRIPTION

Figure 4:
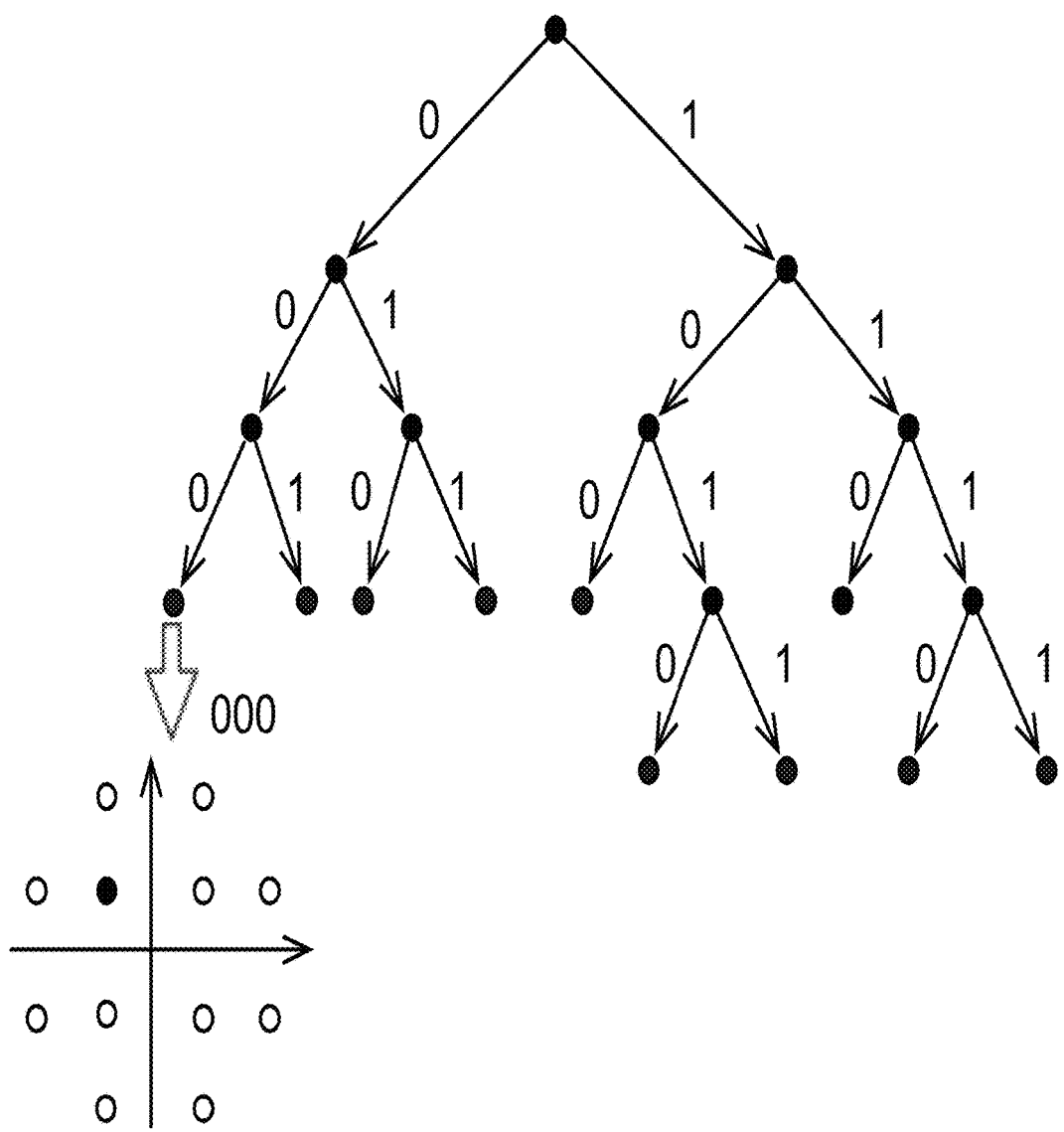
FIG. 4 shows an exemplary tree representation of mapping by Huffman code of 12-QAM, while corresponding mapping rule is shown in FIG. 1A.

FIGS. 1A-1D illustrate various constellation sets, including: a 2D 12-QAM, a received constellation of nonuniform 12-QAM, a 2D 77-QAM, and a received constellation of nonuniform 77-QAM, respectively. To illustrate the constellation shaping based on Huffman code, the following section focuses on the 2D 12-QAM and 77-QAM constellation sets. The former one, which is shown in FIG. 1A, has an average bit rate of 3 bits/T, where T is the symbol duration. Each symbol can carry two, three, or four bits per symbol with different probabilities. It is obvious that the center point standing for 00 has the largest probability of 0.25. The mapping rule is determined by employing the Huffman procedure shown as a tree diagram in FIG. 4. The 2D 12-QAM constellation sets shown in FIG. 1C, which is 16-QAM without the 4 points at the outer layer, and has an average bit rate of 3.5 bits/T. As an illustration, the received symbol constellation for amplified spontaneous emission (ASE) noise dominated channel, based on 2D-9QAM and 2D 12-QAM transmissions are shown in FIGS. 1B and 1D, respectively.

Next, an exemplary signal constellation design for non-uniform signaling scheme based on joint source and channel coding is detailed. The constellation structure of the non-uniform constellation sets is decided by the structure of the binary tree or Huffman code. The constellation structure denotes the numbers of points in each layer. In order to obtain the constellation, which is optimal for non-uniform signaling scheme, an overall search algorithm with the criterion of CFM is used in constellation design. In any data transmission scheme, the system should transmit at a large bit rate, with higher reliability and lower transmitter power as possible. A commonly used figure of merit, named as CFM, for constellation sets is defined as follows:

$$CFM \triangleq \frac{d_{min}^2}{E}$$

where $d_{min}$ denotes the minimum distance of the constellation sets while E denotes the average energy of the constellation sets.

The exemplary algorithm for non-uniform constellation design is an overall search method to determine the radius of each layer and the relative angle for each layer. As introduced above, the constellation structure has already been determined by the structure of the Huffman code, so the input of the algorithm is number of points on each layer and number of layers, represented as $N_i$ and S. The algorithm will search over all possible $R_i$, which denotes the radius of each layer, with a defined step size $\Delta r$. Meanwhile, the algorithm also searches over the relative angle for each layer with another step size $\Delta\theta$. After increase of each step size, the CFM will be calculated. The algorithm will keep searching over a given range of radius and angle, and the combination with maximum CFM will be the output of the algorithm. With the radius of each layer and the relatively angle for each layer determined, the constellation sets can be found with the help of $N_i$ and S.

Figure 2:
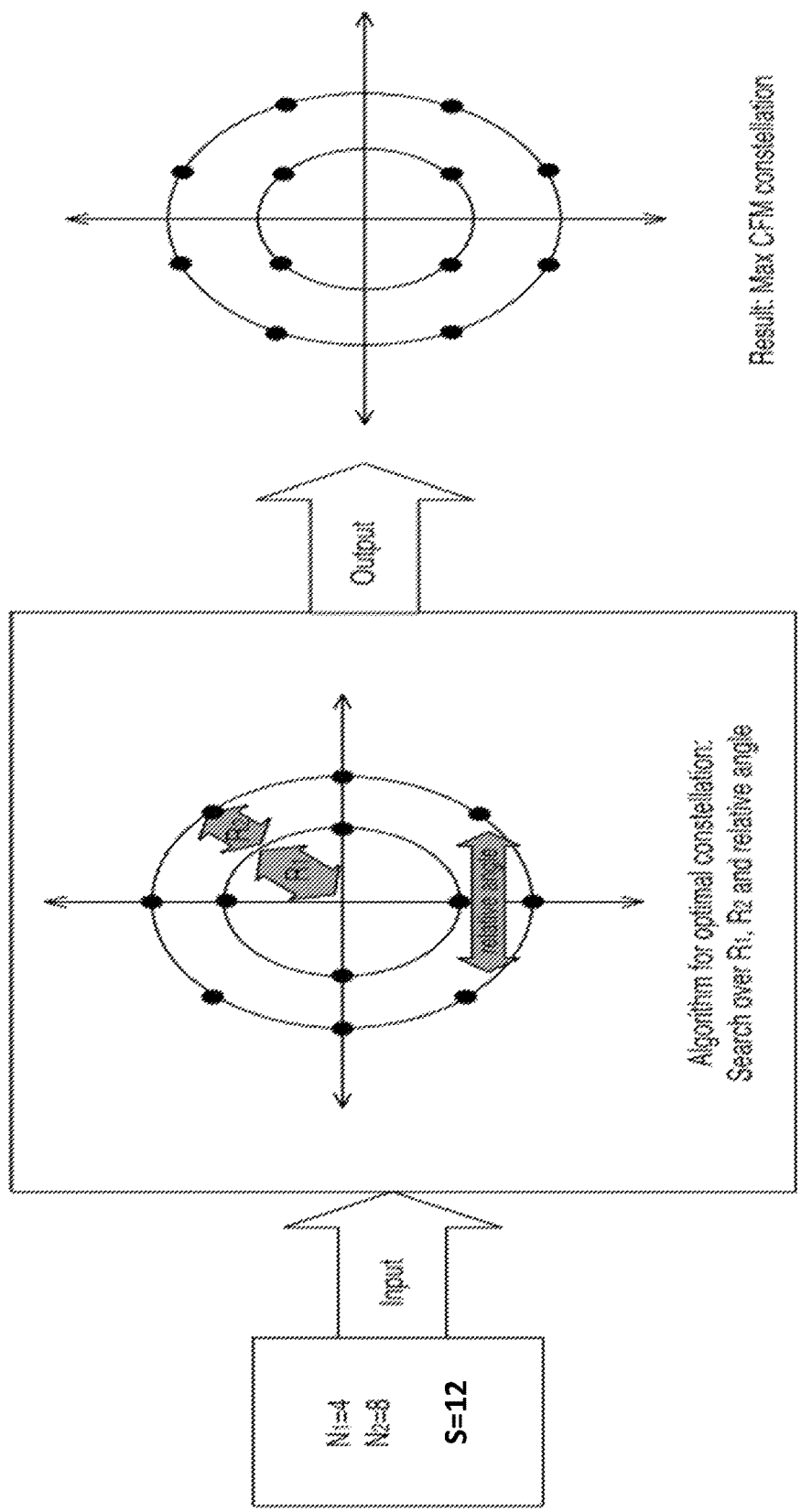
FIG. 2 shows an exemplary 12-QAM design for non-uniform signaling.

An exemplary 12-QAM is shown in FIG. 2. As introduced in previous section, the 12 symbols Huffman code can be represented with binary sequence: 000, 010, 001, 011, 1000, 1100, 1101, 1111, 1010, 1110, 1011 and 1001. With this structure, we can find the structure of the constellation should be $N_1=4$, $N_2=8$ and S=12. We first put 4 points at the first layer, then we place 8 points on the second layer. The next step would be search over all possible radius of each layer with a step size $\Delta r$ and also the relative angle for first and second layer, which is shown in FIG. 2. After searching over a given range, we can find that the resulting constellation 12-QAM has the maximum CFM value. So the 12-QAM is the optimal constellation in CFM sense for 12 symbols non-uniform signaling.

Figure 3A:
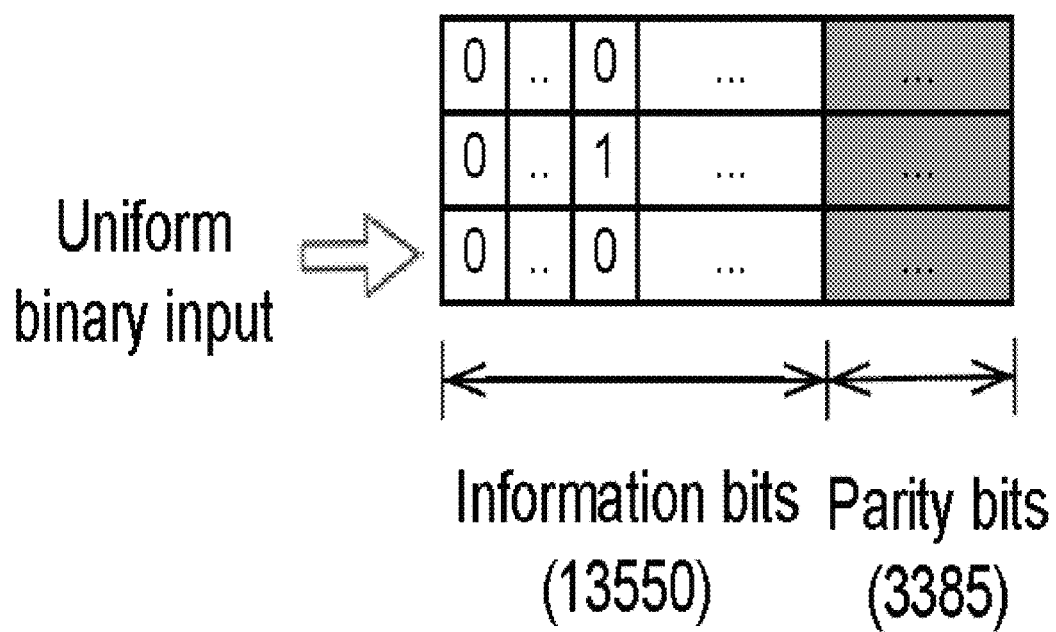
FIGS. 3A-3B show exemplary block interleaver structure for: (a) 8-QAM, (b) 12-QAM, respectively.

Joint source and LDPC coding based coded modulation for non-uniform signaling is detailed next. An exemplary LDPC coding based bit-interleaved coded modulation with independent decoding (BICM-ID) scheme for arbitrary non-uniform signaling is used to maintain the shaping gain brought and possibility to use the joint source channel decoding (JSCD) algorithm. The illustration focuses on LPDC-coded 2D-9QAM, as an illustrative example, with LDPC coding being a systematic quasi-cyclic (QC) LDPC of rate r=0.8, codeword length n=16935, and number of parity bits n−k=3385. The key ingredient of the scheme is the structure of block-interleaver for non-uniform signaling. The conventional block interleaver of 8-QAM is shown in FIG. 3A. The uniform binary data has been written in a row-wise fashion into the interleaver with the size of (n−k)× $\log_2 M$, where M is the size of the constellation. Then each row will be encoded with the systematic LDPC code and the resulting size of the interleaver upon encoding will be n×$\log_2 M$. At the end, each column will be mapped to one of the constellations point.

TABLE 1

The probability of each symbol and corresponding punctured bits.

| Information Bits | Probability | Punctured Bits |
| --- | --- | --- |
| 000 | 0.125 | 1 |
| 010 | 0.125 | 1 |
| 011 | 0.125 | 0 |
| 001 | 0.125 | 1 |
| 1000 | 0.125 | 1 |
| 1100 | 0.125 | 0 |
| 1101 | 0.0625 | N/A |
| 1111 | 0.0625 | N/A |
| 1010 | 0.0625 | N/A |
| 1110 | 0.0625 | N/A |
| 1011 | 0.0625 | N/A |
| 1001 | 0.0625 | N/A |

Figure 3B:
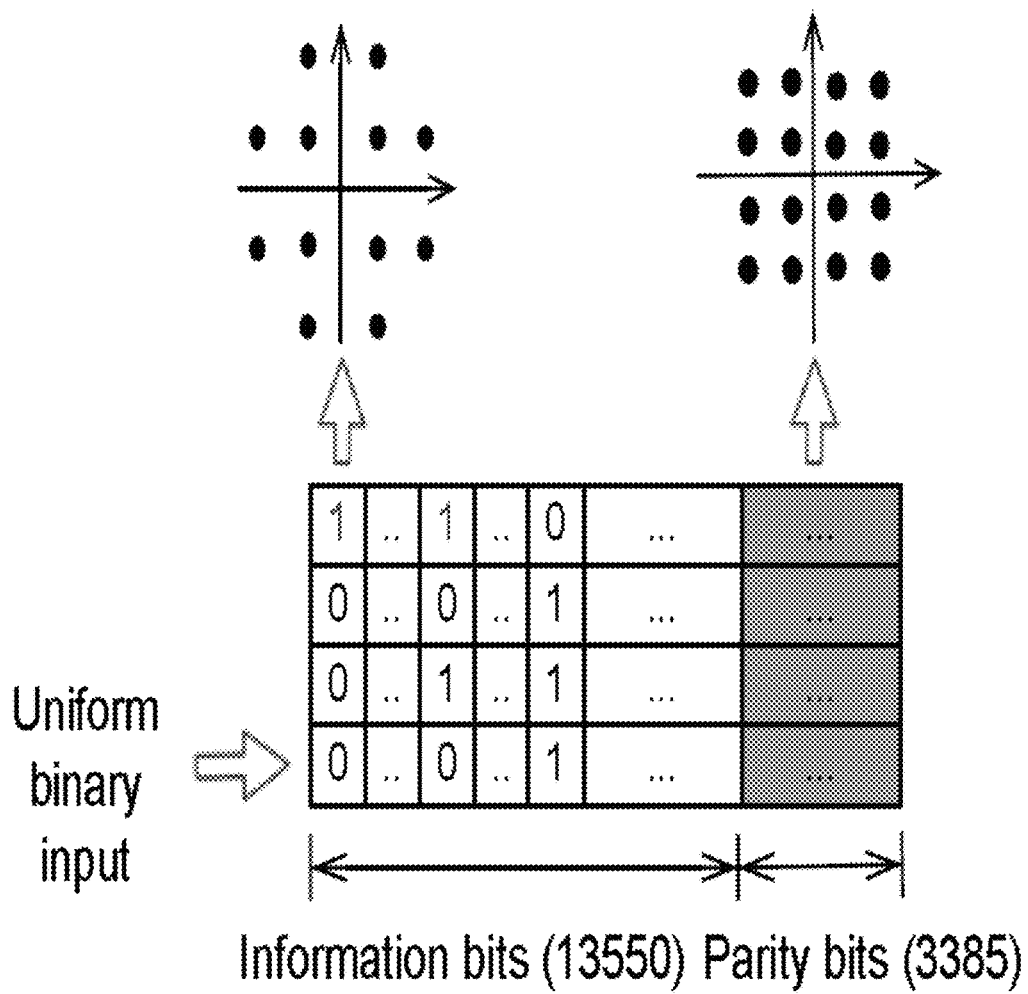

The exemplary interleaver scheme suitable for non-uniform signaling is shown in FIG. 3B. Some of the locations in the exemplary interleaver are filled with puncture bits summarized in Table I. The interleaving process can be formulated as follows, by observing 12-QAM as an illustrative example:

The binary information bits will be first written into the last two rows of the interleaver. The interleaver size for non-uniform signaling is n×$L_M$, where $L_M$ is the maximum source codeword length of the corresponding Huffman code.

Read the bits in column-wise fashion from bottom to the top for the last three rows.

Read the bits column-wise from bottom to the top for the last three rows. If the three bits are in the set {000, 011, 010, 001}, then continue writing the information bits to the fourth row; otherwise, leave the position blank.

Fill the blank positions with the punctured bits according to Table 1.

Encode every row using the QC-LDPC encoder and generate the parity bits' blocks.

As shown in FIG. 3(b), the exemplary interleaver scheme requires one additional row compared to the conventional one with the purpose of maintaining the same bit rate. The bits marked as red can be considered as punctured bits only used for bit log-likelihood ratio (LLR) calculation (they are not transmitted). The parity bits in the block may not satisfy the relation in Table 1, which will cause the ambiguities in bit log-likelihood ratio (LLR) calculation. To solve for this problem, the parity blocks are transmitted with 16-QAM instead of 12-QAM. In each time frame, which corresponds to the time duration for transmitting each block, the exemplary interleaver will first transmit 12-QAM information symbols followed by 16-QAM parity symbols.

Figure 5:
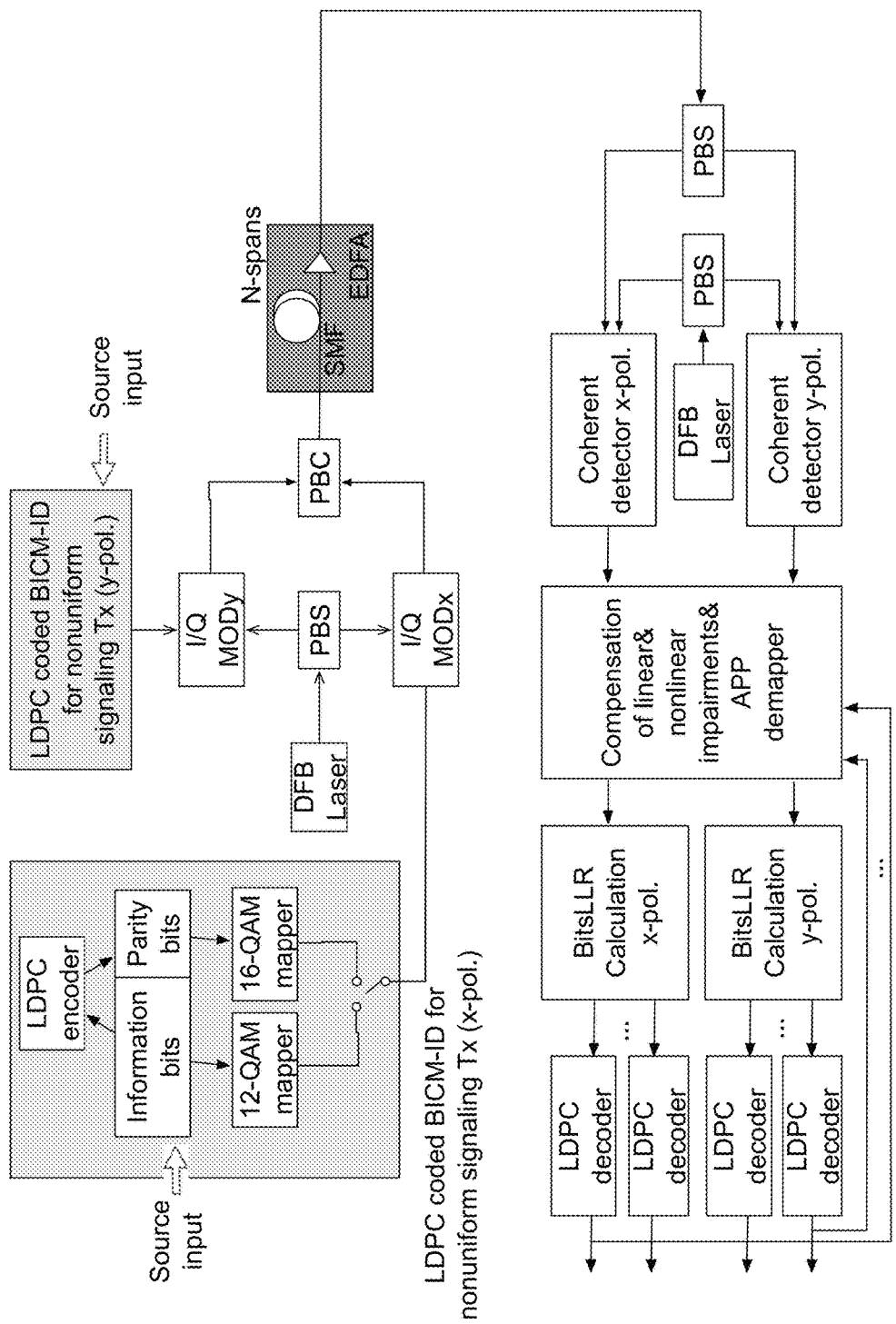
FIG. 5 shows an exemplary polarization-multiplexed LDPC-coded non-uniform signaling transmission scheme.

FIG. 5 shows an exemplary polarization-multiplexed LDPC-coded non-uniform signaling transmission scheme, where PBS/C is polarization beam splitter/combiner, MAP is maximum a posteriori probability, and LLRs are log-likelihood ratios. The entire coded modulation scheme with non-uniform signaling, is suitable for use in polarization-division multiplexing (PDM). The block interleaver is filled by the binary uniform input as well as by QC-LDPC encoder. Then the $L_M$ bits taken from the interleaver in column-wise fashion are mapped onto the 12-QAM constellation, for the information portion, with the help of I/O modulator. For the parity-bit portion of interleaver, the 16-QAM is used instead. Notice that the transmitter first transmitted information bits with 12-QAM and then parity bits with 16-QAM at the same channel condition. The independent polarization streams are combined by polarization beam combiner and transmitted over the system of interest. On receiver side, conventional polarization-diversity receiver is used, with small number of coefficients in digital backpropagation scheme, just to reduce the channel memory so that the complexity of sliding-window MAP equalizer that follows is not too high. The sliding-MAP equalizer provides soft symbol LLRs, which are used to calculate bit LLRs and further passed to LDPC decoders. The iteration between the sliding-MAP equalizer and LDPC decoder is performed until the valid codewords are generated or the maximum number of iterations is reached, which is 5 outer iterations and 20 inner iterations in our illustrative case. Regarding the LDPC decoder, the sum-product algorithm is used here. However, other low-complexity LDPC decoding algorithms can be used as well, including min-sum algorithm, min-sum-plus-correction term algorithm, and attenuated-min-sum algorithm, to mention few.

Figure 6:
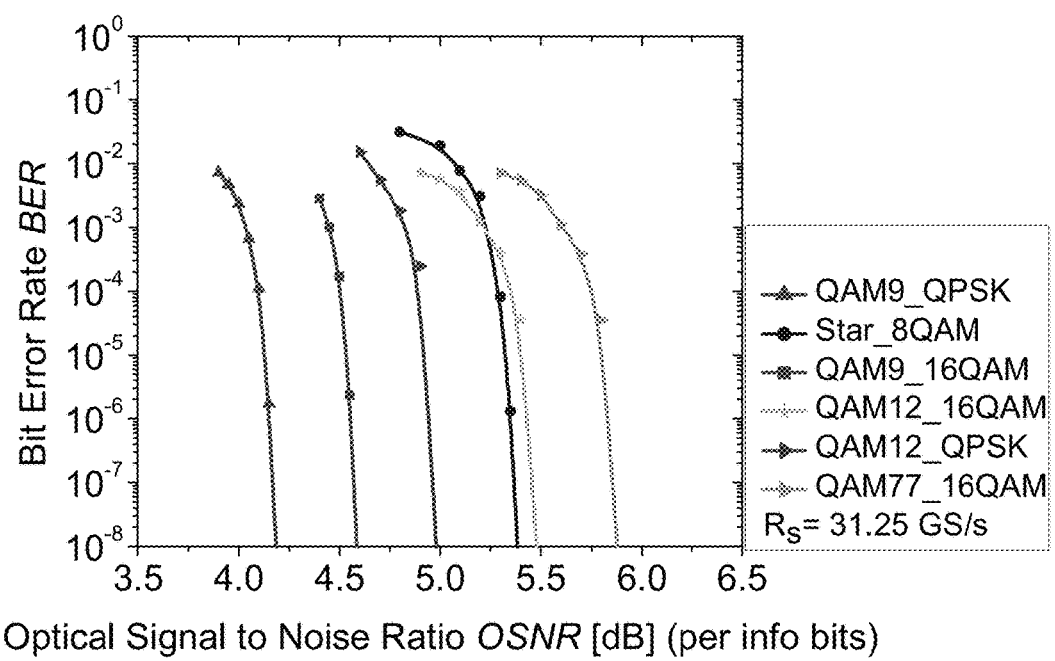
FIG. 6 shows BER results of the exemplary LDPC-coded non-uniform signaling scheme.

The results of Monte Carlo simulations for the embodiment BICM-ID with non-uniform signaling are summarized in FIG. 6. The symbol rate is set to $R_s$=31.25 GS/s. Notice that the legend "QAM12_QPSK" denotes that the information bits are transmitted by 12-QAM based on non-uniform signaling, while the parity bits are transmitted by QPSK. The "QAM9_16 QAM" "QAM8" have the same data rate, which is 2.4 bits/symbol with the consideration of code rate. It is evident that the non-uniform signaling scheme outperforms LDPC-coded 8-QAM by 0.8 dB. If the system uses QPSK to transmit parity bits instead of 16-QAM, the performance can be further improved by 0.4 dB, while the average achievable information rate gets reduced to 2.001 bits/symbol. Meanwhile, the QAM12_QPSK has similar performance with QAM8 but it has an average bit rate of 2.3335 bits/symbol and QAM12_QAM16 can achieve the spectral efficiency (SE) of 2.8 bits/symbol. The QAM77_16 has an average SE of 3.8 bits/symbol. Clearly, the different non-uniform schemes can achieve different shaping gains. Meanwhile, the 8QAM and QAM12_QAM16 has similar performance, but non-uniform scheme has higher SE. FIG. 6 shows just an illustrative simulation of BER results of the LDPC-coded non-uniform signaling scheme.

What is claimed is:

1. A method for optical communication, comprising:
combining joint source coding with low density parity-check (LDPC) channel coding into a nonuniform signaling by mapping low-complexity variable-length prefix codes onto a constellation; and
generating an arbitrary form of the nonuniform signaling where information bits and parity bits are transmitted with different modulation schemes;
generating a nonuniform constellation with an overall search method to determine a radius of each layer and a relative angle for each layer of the constellation, wherein a constellation structure is based on a Huffman code with a number of points on each layer and number of layers, represented as $N_i$ and S, where i in $N_i$ denotes a sequence of N values, further comprising:
searching over all possible $R_i$ as a radius of each layer, with a defined step size $\Delta r$ and where i in $R_i$ denotes a sequence of R values;
searching over a relative angle for each layer with another step size $\Delta\theta$;
after increasing each step size, determining a constellation figure of merit (CFM) and searching over a given range of radius and angle and determining a combination with maximum CFM; and
with the radius of each layer and the relatively angle for each layer specified, determining constellation sets with $N_i$ and S.

2. The method of claim 1, comprising choosing constellation points with a nonuniform probability distribution.

3. The method of claim 1, comprising selecting constellation points according to a Maxwell-Boltzmann distribution to achieve shaping gain in any dimension.

4. The method of claim 1, wherein a coded modulation is used for the arbitrary nonuniform signaling.

5. The method of claim 1, comprising the information bits and the parity bits being transmitted with different modulation schemes in order to achieve a data rate with a modulation scheme.

6. The method of claim 1, comprising the nonuniform signaling being achieved by employing either Huffman coding or Ziv-Lempel algorithm.

7. The method of claim 1, comprising systematic low-density parity-check LDPC coding being used as channel coding.

8. The method of claim 1, comprising systematic low-density parity-check LDPC coding being used as channel coding, wherein bits from source codes are transmitted unchanged, while generalized parity bits, derived from a parity matrix of the LDPC coding, are transmitted.

9. The method of claim 1, comprising providing signal constellation designs for a joint source or low-density parity-check LDPC coding.

10. The method of claim 1, wherein the nonuniform constellation comprises employing either a Huffman coding or Ziv-Lempel method.

11. The method of claim 1, wherein source and channel coding are jointly performed.

12. The method of claim 1, wherein information bits are source-encoded and mapped to specially designed constellation.

13. The method of claim 1, comprising obtaining parity-bits by a systematic LDPC encoder.

14. The method of claim 1, comprising transmitting parity-bits over signal constellations.

* * * * *